United States Patent [19]

Wickenden et al.

[11] 4,335,501

[45] Jun. 22, 1982

[54] MANUFACTURE OF MONOLITHIC LED ARRAYS FOR ELECTROLUMINESCENT DISPLAY DEVICES

[75] Inventors: Dennis K. Wickenden, London; Vera M. Vincent, Hatch End, both of England

[73] Assignee: The General Electric Company Limited, London, England

[21] Appl. No.: 200,257

[22] Filed: Oct. 23, 1980

[30] Foreign Application Priority Data

Oct. 31, 1979 [GB] United Kingdom ................ 7937678

[51] Int. Cl.³ .................. H01L 21/302; H01L 21/316
[52] U.S. Cl. .............................. 29/569 L; 29/576 W; 29/580; 29/584; 204/24; 204/37 R; 357/49
[58] Field of Search ............... 29/580, 569 L, 576 W, 29/576 LW, 584; 357/49; 204/24, 37 R

[56] References Cited

U.S. PATENT DOCUMENTS

| | | | |
|---|---|---|---|
| 3,300,832 | 1/1967 | Cave | 29/25.3 |
| 3,332,137 | 7/1967 | Kenny | 29/576 W |
| 3,341,743 | 9/1967 | Ramsey | 29/576 W |
| 3,343,255 | 9/1967 | Donovan | 29/576 W |
| 3,370,204 | 2/1968 | Cave | 29/576 W |
| 3,381,369 | 5/1968 | Stoller | 29/577 X |
| 3,383,760 | 5/1968 | Shwartzman | 29/576 W |
| 3,407,479 | 10/1968 | Fordemwalt et al. | 29/576 W |
| 3,445,925 | 5/1969 | Lesk | 29/576 W |
| 3,508,980 | 4/1970 | Jackson et al. | 29/576 W |
| 3,559,282 | 2/1971 | Lesk | 29/577 |
| 4,280,273 | 7/1981 | Vincent | 29/569 L |

FOREIGN PATENT DOCUMENTS

| | | | |
|---|---|---|---|
| 54-81311 | 2/1979 | Japan | 29/576 L |
| 54-45311 | 10/1979 | Japan | 29/576 L |
| 1076440 | 7/1967 | United Kingdom . | |
| 1109702 | 4/1968 | United Kingdom . | |
| 1119064 | 7/1968 | United Kingdom . | |
| 1145954 | 3/1969 | United Kingdom . | |
| 1146603 | 3/1969 | United Kingdom . | |
| 1164724 | 9/1969 | United Kingdom . | |
| 1218779 | 1/1971 | United Kingdom . | |

Primary Examiner—G. Ozaki
Attorney, Agent, or Firm—Kirschstein, Kirschstein, Ottinger & Cobrin

[57] ABSTRACT

In the manufacture of a monolithic LED array, in particular a matrix array, in which portions of the array are electrically isolated from one another by channels cut or etched through the slice of n-type material, the channels are formed in two stages, relatively wide channels first being formed from the back surface of the slice to within 50 microns of the front surface, and filled with a glass frit which is bonded to the semiconductor material on each side of the channel, then narrower channels are formed from the front surface of the slice to meet the glass in the initial channels, and are similarly filled with glass frit. A glass powder suspension is introduced into each set of channels by spreading or spinning over the surface of the slice, or by electrophoretic deposition and/or capillary action, then the liquid suspension medium is removed and the glass powder is sintered.

10 Claims, 1 Drawing Figure

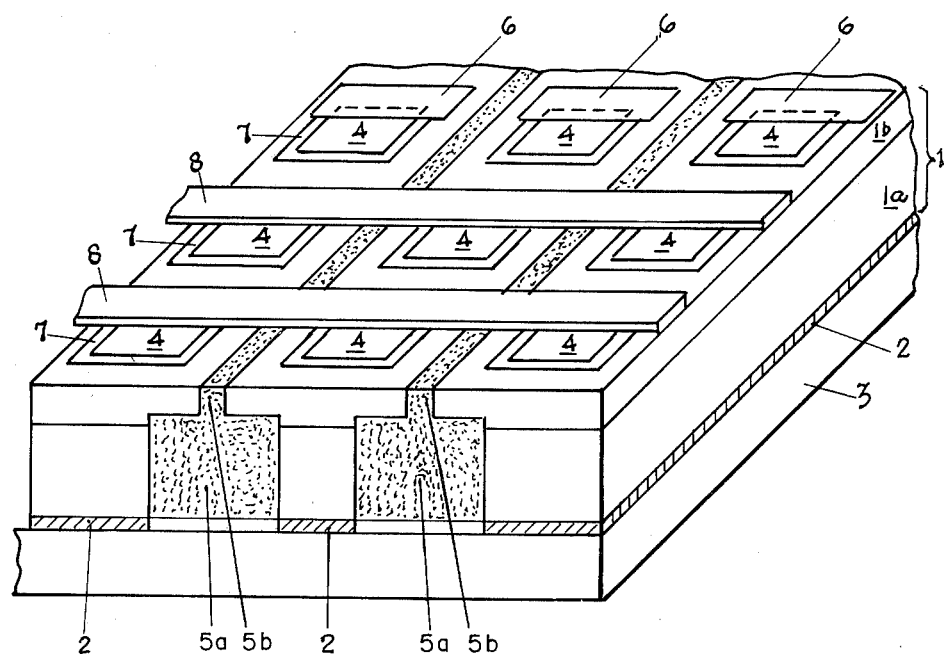

MANUFACTURE OF MONOLITHIC LED ARRAYS FOR ELECTROLUMINESCENT DISPLAY DEVICES

This invention relates to the manufacture of monolithic arrays of light-emitting semiconductor diodes (hereinafter referred to as "LEDs") for electroluminescent display devices of the type including such an array and means for applying operating voltages to the diodes.

A monolithic LED array can be manufactured by a process (hereinafter referred to as a process of the type specified) which includes the steps of providing a slice of n-type semiconductor material, forming a plurality of discrete regions of p-type semiconductor material in the said slice by diffusing p-type material or a p-type dopant into one surface of the slice, to delineate the individual diode areas, forming metal contacts on the surfaces of the p-type and n-type regions of the slice and connecting groups of the p-type contacts together as required for addressing the array, at a convenient stage in the process forming one or more isolation channels through the n-type region of the slice for electrically isolating portions of the array from one another as required, and mounting the whole structure on a suitable insulating substrate. That surface of the semiconductor slice which carries the p-type regions, and the contacts formed on said regions, will hereinafter be referred to as the "front" of the slice and the "front" contacts respectively, and the opposite surface of the slice on which the semiconductor material is wholly n-type and any contacts formed on this surface will be referred to respectively as the "back" of the slice and "back" contacts. The substrate may be bonded either to the back of the slice or to the back contacts.

For example, in the manufacture of a matrix array consisting of a plurality of LEDs arranged in rows and regularly spaced so as to form columns orthogonal to the rows, the diodes in each column having a common back contact on the n-type surface, and the diodes in each row having individual front contacts on the p-type areas which are connected together by a continuous conductor (usually known, and hereinafter referred to, as a "beam lead") for addressing the row in operation of the device, the required electrical isolation between the columns in respect of the n-type regions and common contacts may be effected by cutting or etching channels from the back of the structure, through the common contact layer and the n-type slice, in such a manner that, while the columns are completely isolated from one another, the overlaid beam leads are undamaged. This method of isolation requires the array to be subsequently handled, for the purpose of mounting the array on to a substrate, in a highly vulnerable and fragile state, as the array is held together solely by the adhesion of small areas of the beam leads to small areas of the semiconductor strips constituting the diode columns.

In another method of effecting the isolation, the array is first mounted on its substrate, and then the requisite channels are etched from the front of the slice, after the beam leads are formed, using the undercutting properties of the etch to provide isolation. However, this technique is limited to coarse geometry arrays, due to the anisotropy of such etches.

It is an object of the present invention to provide an improved process for the manufacture of a monolithic LED array, whereby handling of the structure subsequently to the formation of the isolation channels is facilitated, and a large area, beam leaded, high resolution array can be obtained.

According to the invention, in a process of the type specified for the manufacture of a monolithic array of light-emitting semiconductor diodes, for an electroluminescent display device, each said isolation channel is formed in two stages, the said process including the further steps of mounting the front surface of the slice of n-type material on a first support layer, forming one or more initial channels from the back surface of the slice through a major part of the thickness thereof, filling each said channel with a suspension of glass powder particles in a liquid medium, removing the liquid from the channel or channels so filled, heating the slice to a sufficiently high temperature to cause the glass particles in each channel to sinter so as to form a glass frit contained in the channel and bonded to the semiconductor material on each side of the channel, and repeating the said steps of filling the channel or channels with glass powder suspension, removing the liquid and sintering the glass, successively, for the number of times required to fill each channel completely with said glass frit, then mounting the back surface of the slice on a second support layer and removing said first support layer from the front surface of the slice, then forming one or more further channels from the front surface of the slice, such that a said further channel is formed to correspond in position to each said initial channel, each said further channel being narrower than the corresponding initial channel and extending through the slice for a sufficient depth to meet the glass frit filling the said initial channel, and filling said further channel or channels with glass frit by carrying out said steps of filling each channel with glass powder suspension, removing the liquid, and sintering the glass, to form a composite glass-filled channel or channels each consisting of a narrow front portion and a wider back portion.

Each said initial channel is suitably terminated at a distance of less than 50 microns from the front surface of the n-type slice.

After the said further channel or channels have been filled with glass frit, the second support layer may be removed from the back surface of the slice to permit further processing, for example if it is desired to form back contacts on the n-type regions of the slice or to mount the slice on a substrate of different composition from the support layer. Alternatively, the second support layer may be retained to constitute, or to be mounted on, the substrate, if back contacts are not required.

The isolation channel or channels may be formed by mechanical cutting or by chemical etching. Usually a plurality of said composite isolation channels will be required in an LED array, and the invention will hereinafter be described with reference to such an array, but it is to be understood that the operations described are equally applicable to the manufacture of an array having a single composite isolation channel. The glass employed for filling the channels may be of any suitable composition that can be sintered at a temperature which is not so high as to cause damage to the semiconductor material; the glass must also have a thermal expansion coefficient compatible with that of the semiconductor material, so that no strains or cracks will be produced in either material during the sintering process.

Usually the p-type material or dopant is diffused into the required areas of the front surface of the slice after the composite isolation channels have been formed and filled with glass frit. However, in some cases, if the temperature to which the slice is required to be heated for effecting the diffusion of the p-type material into the n-type material is appreciably higher than the sintering temperature of the glass employed for filling the channels, it may be desirable to form the diffused p-type regions before the formation and filling of the channels.

The filling of the isolation channels with a glass frit bonded to the semiconductor material is advantageous in that it produces a composite slice of robust construction, enabling the subsequent processing steps to be carried out readily without risk of damaging the semiconductor slice; the planar composite glass/semiconductor structure of the front and back surfaces of the slice allows diffusion of the p-type material and formation and connection of the front contacts, and formation of back contacts if required, to be carried out by the usual techniques. Furthermore, the glass-filled channels improve the mechanical strength of the completed array while maintaining the required electrical isolation between n-type regions. The formation of the channels in two stages, in accordance with the invention, is advantageous in that the filling of the channels with a glass powder suspension is facilitated, in the case of the initial channels by their greater width, and in the case of the further, narrower, channels by their small depth. Furthermore, in operation of an LED array having glass-filled isolation channels formed by this two-stage process, the degree of resolution obtainable will be determined by the width of the narrower, front portions of the channels, and can thus be higher than that obtainable with conventional isolation channels of uniform, somewhat greater, width throughout the slice.

The liquid suspension of glass particles employed successively for filling the initial and further isolation channels may consist of a slurry of glass powder in a binder medium which can be applied, for example by spreading or spinning, over that surface of the slice in which the openings of the channels are situated, so that the slurry fills the channels. The excess slurry is removed from the surface areas of the slice between and outside the channels before removal of the liquid medium from the channels and sintering of the glass therein. The binder medium may consist of a photoresist, or any suitable known binder, in an organic solvent, and after evaporation of the solvent the binder may be removed by appropriate chemical means, or may be oxidized and vaporised by heating in the presence of oxygen, or in the case of a photoresist may be exposed to ultra violet radiation and then removed by immersion of the slice in a standard developer solution. During sintering the glass flows and is thus reduced in volume: it is therefore necessary to repeat the procedure of filling the channels with slurry, removing solvent and binder, and sintering the glass several times in order to effect complete filling of the channels.

An alternative method of introducing glass particles into the isolation channels is by electrophoretic deposition: the semiconductor slice, with the required channels formed therein and the remaining surface areas of the slice suitably masked, is immersed in a suspension of glass particles in a suitable liquid containing a surfactant which imparts an electric charge to the glass particles, an electrode is also immersed in the suspension, the semiconductor slice functioning as the second electrode, and an electric field of appropriate polarity is applied between the slice and the electrode to cause the glass particles to be attracted to the slice and deposited in the channels. The slice is then dried in an oven to remove the liquid introduced into the channels with the glass particles, and the slice is heated to sinter the glass.

In another alternative method of depositing glass particles in the channels, the slice is immersed in a suspension of glass particles in a suitable liquid having high surface tension or containing a surfactant, the slice being so oriented in the liquid that the longitudinal axes of the channels lie substantially orthogonally to the surface of the liquid, then the slice is slowly withdrawn from the liquid: during withdrawal of the slice, the glass suspension is drawn into the portions of the channels rising above the surface of the liquid, by capillary action.

One preferred method of depositing the glass particles in the channels comprises a combination of the electrophoretic and capillary action procedures described above: thus the slice is immersed in a glass powder suspension as aforesaid, with the longitudinal axes of the channels oriented orthogonally to the surface of the liquid, and electrophoretic deposition of glass particles in the channels is effected first, and then the slice is slowly withdrawn from the suspension to promote further deposition by capillary action. This procedure is advantageous, since the electrophoretic action ensures coverage of the innermost regions of the channel walls with glass particles, and the subsequent capillary action ensures that the channels are completely filled with glass particles.

Suitable semiconductor materials for use in the manufacture of the LED array include, for example, gallium arsenophosphide, gallium arsenide, gallium indium phosphide, gallium aluminum arsenide, gallium phosphide, and gallium indium arsenide phosphide, in each case containing suitable dopants for producing n-type or p-type material as required: a preferred p-type material is zinc doped gallium arsenophosphide, and preferred n-type materials are gallium arsenophosphide doped with selenium or tellurium, and silicon doped gallium arsenide. The slice of n-type semiconductor material may be of graded composition, and is suitably prepared by epitaxial deposition of material of the required composition or range of compositions on an initial thin slice of similar or allied composition. The diffusion of p-type material into the front surface of the slice is carried out by a well-known process, the pattern of p-type regions being delineated by conventional photolithographic techniques.

The contacts are composed of suitable metals, for example chromium, nickel, nickel-chromium alloy, or titanium, overlaid with gold, and may be formed by vacuum evaporation in known manner, the required contact patterns being delineated by photolithographic techniques, and the contacts so formed may be thickened by electroplating if desired. The required connections between front contacts on the p-type regions preferably consist of beam leads, formed by depositing, suitably by electroplating, photolithographically delineated strips of metal, for example gold, on the appropriate portions of the front of the slice so as to overlay groups of the p-contacts. Alternatively the connetions between the p-contacts may be made by stitch-bonding.

The contacts for the n-type regions of the array may be in the conventional form of a continuous metal layer covering the whole of the back surface of each such region. However, for convenience in manufacture of the device, the n-contacts may advantageously be located on the front surface of the n-type slice, so that all contacts are accessible from the front of the array; a single small contact on the front of each n-type region, for example located at one end of each column in a matrix array, may be sufficient, but preferably two n-contacts are provided on each region, for example one at each end of each column, to ensure reliability of operation of the device. The advantage of such an arrangement is that all the contacts, on both p-type and n-type regions, can be connected to conducting tracks on the substrate by stitch-bonding from the contacts on the edges of the front of the slice to the said tracks. If desired, where n-contacts are located on the front of the slice, additional continuous contacts may be provided over the back surfaces of the n-type regions, to ensure that electric current introduced through the front n-contacts is evenly distributed throughout the n-type regions.

Suitable materials for the substrate of the array include, for example, ceramic alumina, sapphire, and high resistivity silicon. If the LED array includes back contacts, an area of the substrate corresponding to the area of the array is metallised to enable the contacts to be bonded to the substrate, but if no back contacts are present on the array, the back surface of the array, composed of n-type semiconductor material and the glass frit in the isolation channels, is bonded directly to the insulating substrate material. The substrate also carries the requisite conducting tracks to form leads for addressing the array in operation of the device.

Some specific processes, in accordance with the invention, for the manufacture of high resolution matrix LED arrays, will now be described by way of example, with reference to the accompanying diagrammatic drawing, which is a perspective view of a portion of an array having isolation channels formed by the two-stage process of the invention.

EXAMPLE 1

The array shown in part in the drawings consists of a plurality of columns formed from a rectangular slice of n-type semiconductor material 1, composed of silicon doped gallium arsenide (GaAs) 1a overlaid by tellurium doped gallium arseno-phosphide (GaAsP) 1b, with an ohmic contact 2 covering the whole of the back surface of each column and bonded to a ceramic substrate 3, and with front surface diffused regions of p-type GaAsP, 4, delineating the diode matrix and provided with individual front ohmic contacts connected together in rows approximately orthogonal to the columns. The columns are separated from one another by isolation channels filled with sintered glass frit, indicated by stippling, each channel consisting of a relatively wide portion 5a, extending from the back surface of the n-type semiconductor slice 1 to a distance of 25 microns from the front surface of the slice, and a narrower portion 5b formed from the front surface of the slice to the centre of the portion 5a. The portions 5a and 5b are, for example, 100 microns and 25 microns wide respectively. Each of the front contacts consists of a rectangular metal pad 6 overlapping the p-type region, with a narrow conducting strip 7 formed around the edge of the remainder of the p-type region; these contacts are connected together by continuous beam leads 8 laid across the array, overlying the respective rows of contact pads 6 and the intervening glass-filled channels 5b: one of the beam leads has been omitted from the drawing, in order to show one row of contact pads 6. Alternatively, the rows of front contact pads 6 may be connected together by stitch-bonding (not shown in the drawing).

In the manufacture of the array described above with reference to the drawing, an n-type slice 1 of the desired thickness is produced by depositing an epitaxial layer of tellurium doped GaAsP on an initial slice of silicon doped GaAs, and a supporting layer of silica or silicon nitride is deposited over the front (GaAsP) surface of the slice. The channels 5a are then cut or etched from the back surface of the slice, and are filled with a proprietary glass powder slurry in a photoresist binder medium, by spreading or spinning the slurry over the front surface of the slice, the excess slurry being scraped off the semiconductor surface areas between and outside the channels. The slice is then heated to evaporate the solvent of the slurry, further heated in oxygen or air to fire off the binder, and finally heated at 750° C. to sinter the glass particles in the channels to form a glass frit bonded to the semiconductor columns. The slice is then re-mounted on a support layer applied to its back surface, the support layer on the front surface is removed, for example by lapping or polishing, and the channels 5b are cut or etched from the front surface and are filled with glass frit by the same procedure as that employed for filling the channels 5a with frit. The support layer is then removed from the back surface of the slice.

The required p-type regions are then formed by diffusing zinc into the surface areas 4, the diode matrix pattern being delineated in a suitable diffusion mask material by conventional photolithographic techniques and the slice being heated to 700° C. for the diffusion process.

The front contacts 6, 7 are formed by vacuum evaporation of chromium and then gold, photolithographic techniques again being used for delineating the contact pattern, and the back contacts 2, composed of a gold-tin alloy, are deposited on the semiconductor columns by a procedure similar to that used for forming the front contacts. The array is heated to 500° C. to effect partial diffusion of the metal of the front and back contacts into the semiconductor material, and then the beam leads 8 are formed by electroplating gold on to the requisite areas of the front surface of the array through a photolithographically produced mask. Finally the array is mounted on the substrate 3 by soldering the back contacts to a delineated metalised surface area of the substrate. The substrate suitably consists of either high resistivity silicon with a surface layer of thermal or pyrolytic silicon oxide overlaid by gold, or ceramic alumina metallised with gold, and the solder used may be a gold-germanium alloy; the glass frit strips on the back surface of the array are not wetted by the solder. The beam leads 8 are connected to conducting tracks on the substrate (not shown) by stitch-bonding.

EXAMPLE 2

The process of this example includes an alternative method of filling the isolation channels with glass powder suspension, which can be employed in the manufacture of an array of the form shown in the drawing.

The n-type semiconductor slice is prepared as described in Example 1, and both the front and back surfaces of the slice are coated with silicon nitride (or other suitable non-conducting masking material). The required isolation channels 5a are delineated by removing portions of the silicon nitride coating from the back surface, by a photolithographic method or by cutting through the coating, and the channels are cut or etched in the n-type material. The slice is then immersed in a suspension of glass particles in isopropyl alcohol containing 0.25% to 1.0% by volume of a surfactant, suitably a commercially available material designated "FC-807", the proportion of glass particles in the liquid being 10% weight/volume, and the slice being so oriented in the suspension that the longitudinal axes of the channels are orthogonal to the surface of the liquid. A platinum electrode is also immersed in the suspension, and a current of 6 to 8 mA is passed through the suspension between the slice as anode and the electrode as cathode, for 4 to 12 hours: the glass particles are negatively charged by the surfactant and are therefore deposited in the channels in the semiconductor slice. After switching off the current, the slice is slowly withdrawn from the liquid, so that as the channels emerge above the surface of the liquid, they are completely filled with glass suspension drawn into them by capillary action. The slice is then dried in an oven at 100° C., and heated to effect sintering of the glass particles.

The above-described procedure is repeated for delineating and forming the channels 5b from the front surface of the slice, and filling them with glass powder suspension and converting the latter to glass frit.

After completion of the formation of the glass-filled channels, the diode areas are delineated by removing further portions of the silicon nitride coating from the front surface of the slice, the silicon nitride is removed from the back of the slice, and the p-type regions, contacts and beam leads are formed as described in Example 1, the completed array finally being mounted on a substrate.

It will be understood that, in either of the methods described in the above specific examples, the steps of filling each portion of the isolation channels with glass powder slurry or suspension, removing the liquid medium and sintering the glass may be repeated as necessary to effect complete filling of the channels with glass frit, before the further processing steps are carried out.

We claim:
1. A process for the manufacture of a monolithic array of light-emitting semiconductor diodes, for an electroluminescent display device, which includes the steps of providing a slice of n-type semiconductor material, forming a plurality of discrete regions of p-type semiconductor material in the said slice by diffusing p-type material into the front surface of the slice, to delineate individual diode areas, forming individual metal contacts on the surfaces of said p-type regions and connecting said contacts together in groups as required for addressing the array, forming at least one isolation channel through the n-type slice for electrically isolating portions of the array from one another, forming at least one metal contact on a surface of the n-type region of each of said mutually isolated portions, and bonding the back surface of the structure so formed to an insulating substrate, wherein each said isolation channel is formed in two stages, the said process including the further steps of
  (a) mounting the front surface of the slice of n-type materal on a first support layer,
  (b) forming at least one initial channel from the back surface of the slice through a major part of the thickness thereof,
  (c) filling each said channel with a suspension of glass powder particles in a liquid medium,
  (d) removing the liquid from each channel so filled,
  (e) heating the slice to a sufficiently high temperature to cause the glass particles in each channel to sinter so as to form a glass frit contained in the channel and bonded to the semiconductor material on each side of the channel,
  (f) repeating said steps (c), (d) and (e) successively for the number of times required to fill each channel completely with said glass frit,
  (g) mounting the back surface of the slice on a second support layer,
  (h) removing said first support layer from the front surface of the slice,
  (i) forming at least one further channel from the front surface of the slice, such that a said further channel is formed to correspond in position to each said initial channel and extending through the slice for a sufficient depth to meet the glass frit filling the said initial channel,
  (j) and carrying out said steps (c), (d), (e) and (f) to fill each said further channel with said glass frit, to form at least one composite glass-filled channel consisting of a narrow front portion and a wider back portion,
  the formation of each of said initial and further channels and filling thereof with said glass frit being caried out before the formation of the said contacts on the p-type and n-type regions of the slice.

2. A process according to claim 1, wherein each said initial channel is terminated at a distance of less than 50 microns from the front surface of the n-type slice.

3. A process according to claim 1, wherein each said initial channel is formed to a width of 100 microns, and each aid further channel is formed to a width of 25 microns.

4. A process according to claim 1, wherein subsequently to the filling of each said further channel the said second support layer is removed to permit further processing of the back of the slice.

5. A process according to claim 1, wherein the said second support layer is retained on the back surface of the slice to constitute at least part of the said substrate.

6. A process according to claim 1, wherein the said suspension employed successively for filling the said initial and further isolation channels consists of a slurry of glass powder in a binder medium, and wherein the said slurry is applied over that surface of the slice in which each channel opening is situated, so as to fill each channel, the excess slurry being removed from the surface areas of the slice before removal of the binder medium from each channel and sintering of the glass therein.

7. A process according to claim 6, wherein the said binder medium consists of a photoresist in an organic solvent, and wherein the binder is removed by exposing the slice to ultra violet radiation and then immersing it in a developer solution.

8. A process according to claim 1, wherein for introducing glass particles into the said initial and further isolation channels formed in the slice of n-type semiconductor material, the remaining surface areas of the slice are masked, the slice is immersed, together with an electrode, in a suspension of glass particles in a liquid containing a surfactant capable of imparting an electric charge to the glass particles, and an electric field of appropriate polarity is applied between the slice and the electrode to cause electrophoretic deposition of glass particls in each channel.

9. A process according to claim 1, wherein for introducing glass particles into the said initial and further isolation channels formed in the slice of n-type semiconductor material, the slice is immersed in a suspension of glass particles in a liquid having high surface tension, the slice being so oriented in the suspension that the longitudinal axis of each channel is disposed substantially orthogonally to the surface of the liquid, and the slice is slowly withdrawn from the suspension, so that the suspension is drawn into each channel, rising above the surface of the liquid, by capillary action.

10. A process according to claim 1, wherein for introducing glass particles into the said initial and further isolation channels formed in the slice of n-type semiconductor material, the remaining surface areas of the slice are masked, the slice is immersed, together with an electrode, in a suspension of glass particles in a liquid containing a surfactant capable of imparting an electric charge to the glass particles, the slice being so oriented in the suspension that the longitudinal axis of each channel is disposed substantially orthogonally to the surface of the liquid, an electric field of appropriate polarity is applied between the slice and the electrode to cause electrophoretic deposition of glass particles in each channel, then the electric field is removed and the slice is slowly withdrawn from the suspension, so that further deposition of the suspension in each channel rising above the surface of the liquid is effected by capillary action.

* * * * *